(12) United States Patent
Li et al.

(10) Patent No.: US 11,812,558 B2
(45) Date of Patent: Nov. 7, 2023

(54) DISPLAY DEVICE AND ASSEMBLY METHOD THEREOF

(71) Applicants: Chengdu BOE Optoelectronics Technology Co., Ltd., Sichuan (CN); BOE Technology Group Co., Ltd., Beijing (CN)

(72) Inventors: Fan Li, Beijing (CN); Xiaolong Zhu, Beijing (CN); Hengzhen Liang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 520 days.

(21) Appl. No.: 16/959,052

(22) PCT Filed: Aug. 1, 2019

(86) PCT No.: PCT/CN2019/098870
§ 371 (c)(1),
(2) Date: Jun. 29, 2020

(87) PCT Pub. No.: WO2021/016988
PCT Pub. Date: Feb. 4, 2021

(65) Prior Publication Data
US 2022/0007513 A1    Jan. 6, 2022

(51) Int. Cl.
*H05K 1/00* (2006.01)
*H05K 1/18* (2006.01)
(Continued)

(52) U.S. Cl.
CPC ......... *H05K 1/189* (2013.01); *H05K 7/20963* (2013.01); *H05K 9/0054* (2013.01);
(Continued)

(58) Field of Classification Search
CPC .... H05K 1/189; H05K 1/147; H05K 7/20963; H05K 9/0054; H05K 9/0081;
(Continued)

(56) References Cited

U.S. PATENT DOCUMENTS

2002/0135727 A1* 9/2002 Nakaminami ......... H01R 12/62
349/149
2005/0243239 A1 11/2005 Kondo et al.
(Continued)

FOREIGN PATENT DOCUMENTS

CN          2661658 Y      12/2004
CN          1693954 A      11/2005
(Continued)

OTHER PUBLICATIONS

International search report of PCT application No. PCT/CN2019/098870 dated Apr. 22, 2020.
(Continued)

*Primary Examiner* — Anatoly Vortman
*Assistant Examiner* — Zhengfu J Feng
(74) *Attorney, Agent, or Firm* — Lippes Mathias LLP

(57) ABSTRACT

A display device includes: a display panel; a circuit board, one end of the circuit board being connected to the display panel, and the circuit board being at least partially disposed on a back surface of the display panel and includes a device region on a side distal from the display panel; at least one electronic device disposed in the device region; and an adhesive tape disposed on a side, distal from the display panel, of the circuit board and bonded to a back surface of at least a part of the circuit board and the back surface of at least a part of the display panel. At least a part of the at least one electronic device in the device region is disposed between the adhesive tape and the back surface of the display panel.

19 Claims, 6 Drawing Sheets

(51) Int. Cl.
*H05K 7/20* (2006.01)
*H05K 9/00* (2006.01)
*G06F 3/044* (2006.01)
*H05K 1/14* (2006.01)

(52) U.S. Cl.
CPC ............... *G06F 3/044* (2013.01); *H05K 1/147* (2013.01); *H05K 9/009* (2013.01); *H05K 9/0081* (2013.01); *H05K 2201/056* (2013.01); *H05K 2201/10128* (2013.01); *H05K 2201/10136* (2013.01)

(58) Field of Classification Search
CPC ............ H05K 9/009; H05K 2201/056; H05K 2201/10128; H05K 2201/10136; G06F 3/044; G06F 1/1656; G06F 1/1626; G06F 1/1637; H04M 1/0277; H04M 1/0266; G02F 1/133; G09F 9/00
USPC .......................................................... 361/719
See application file for complete search history.

(56) References Cited

U.S. PATENT DOCUMENTS

| | | |
|---|---|---|
| 2006/0098412 A1 | 5/2006 | Kim et al. |
| 2013/0021782 A1 | 1/2013 | Yan et al. |
| 2014/0306942 A1* | 10/2014 | Ahn ...................... G06F 1/1652 345/206 |
| 2014/0326484 A1 | 11/2014 | Tajima et al. |
| 2017/0099736 A1* | 4/2017 | Jung .................. H05K 7/20963 |
| 2019/0014671 A1* | 1/2019 | Ahn .................... H05K 1/028 |
| 2019/0350081 A1* | 11/2019 | Park ....................... G06F 1/203 |
| 2020/0022261 A1* | 1/2020 | Choi .................. H05K 7/20445 |
| 2021/0174044 A1 | 6/2021 | Jo et al. |

FOREIGN PATENT DOCUMENTS

| | | |
|---|---|---|
| CN | 1774163 A | 5/2006 |
| CN | 102289089 A | 12/2011 |
| CN | 203225988 U | 10/2013 |
| CN | 107193166 A | 9/2017 |
| EP | 3352045 A1 | 7/2018 |
| EP | 3418854 A1 | 12/2018 |
| EP | 3428718 A1 | 1/2019 |
| WO | 2019112314 A1 | 6/2019 |

OTHER PUBLICATIONS

Extended European search report of counterpart European application No. 19932223.1 dated Jul. 11, 2022.

* cited by examiner

DISPLAY DEVICE AND ASSEMBLY METHOD THEREOF

CROSS-REFERENCE TO RELATED APPLICATION

The present application is a national phase application based on PCT/CN2019/098870, filed on Aug. 1, 2019, the content of which is incorporated herein by reference.

TECHNICAL FIELD

The present disclosure relates to the field of display technologies, and in particular, relates to a display device and an assembly method thereof.

BACKGROUND

As an important part of electronic devices, a display device usually includes a display panel and a circuit board. One end of the circuit board is connected to the display panel, and the other end of the circuit board is disposed on and fixed to a back surface of the display panel.

SUMMARY

Embodiments of the present disclosure provide a display device and an assembly method thereof.

At least one embodiment of the present disclosure provides a display device. The display device includes:
  a display panel;
  a circuit board, one end of the circuit board being connected to the display panel, and the circuit board being at least partially disposed on a back surface of the display panel and including a device region on a side distal from the display panel;
  at least one electronic device disposed in the device region; and
  an adhesive tape disposed on the side distal from the display panel of the circuit board and bonded to a back surface of at least one part of the circuit board and the back surface of the display panel, wherein
  at least one part of the at least one electronic device in the device region is disposed between the adhesive tape and the back surface of the display panel, and
  the adhesive tape includes a first insulating layer, a functional layer, and a second insulating layer that are sequentially laminated, wherein the first insulating layer is bonded to at least one part of the circuit board and at least one part of the display panel, and the functional layer includes at least one of an electromagnetic shielding layer, an electromagnetic wave absorbing layer, and a heat dissipating layer.

Optionally, the functional layer includes the electromagnetic shielding layer; the second insulating layer covers the electromagnetic shielding layer, and the electromagnetic shielding layer is provided with an exposed region not covered by the first insulating layer; and the back surface of the display panel is provided with a metal layer, the circuit board is provided with a ground terminal on an edge, and the exposed region is electrically connected to both the metal layer and the ground terminal.

Optionally, the electromagnetic shielding layer, the first insulating layer, and the second insulating layer each include a main body portion and a connecting arm protruding from a side of the main body portion; wherein the main body portions of both the first insulating layer and the second insulating layer wrap the main body portion of the electromagnetic shielding layer, and the exposed region is disposed on the connecting arm of the electromagnetic shielding layer.

Optionally, a number of the connecting arm in each of the electromagnetic shielding layer, the first insulating layer, and the second insulating layer is two; wherein the two connecting arms of each of the electromagnetic shielding layer, the first insulating layer, and the second insulating layer are disposed on two sides of one side edge of the device region of the circuit board respectively.

Optionally, the functional layer further includes the electromagnetic wave absorbing layer wrapped between a first film layer and a second film layer in the adhesive tape; wherein the first film layer and the second film layer are layers, disposed on two sides of the electromagnetic wave absorbing layer, in the adhesive tape.

Optionally, the electromagnetic wave absorbing layer has a shape similar to that of the main body portion of the electromagnetic shielding layer.

Optionally, the functional layer further includes the heat dissipating layer having a shape similar to that of the main body portion of the electromagnetic shielding layer.

Optionally, the adhesive tape further includes an electronic device buffer layer disposed on a side surface, distal from the display panel, of the second insulating layer; wherein an orthographic projection of at least one part of the at least one electronic device on the display panel is within an orthographic projection of the electronic device buffer layer on the display panel.

Optionally, at least one part of the at least one electronic device includes an integrated circuit chip on the circuit board, and the electronic device buffer layer has a shape similar to that of the integrated circuit chip.

Optionally, the circuit board includes a first flexible circuit board and a packaging circuit board; one end of the packaging circuit board is connected to the display panel and another end of the packaging circuit board is connected to one end of the first flexible circuit board, and the device region includes a partial region of the packaging circuit board and a partial region of the first flexible circuit board.

Optionally, the display device further includes a touch layer and a second flexible circuit board; wherein the touch layer is integrated on the display panel, one end of the second flexible circuit board is connected to the touch layer and another end of the second flexible circuit board is connected to the first flexible circuit board, and the second flexible circuit board is bonded to an outer surface of the adhesive tape, the outer surface of the adhesive tape is oriented away from the back surface of the display panel.

Optionally, the electromagnetic shielding layer includes a conductive fabric.

Optionally, the electromagnetic wave absorbing layer is made of at least one of ferrite and barium titanate.

Optionally, the heat dissipating layer is made of graphite.

Optionally, the electronic device buffer layer is made of foam.

At least one embodiment of the present disclosure provides an assembly method of a display device. The assembly method includes:
  providing a display panel and a circuit board, wherein one end of the circuit board being connected to the display panel, the circuit board being at least partially disposed on a back surface of the display panel and including a device region on a side distal from the display panel, wherein at least one electronic device is disposed in the device region; and bonding a side surface of an adhesive tape to a back surface of at least one part of the circuit board and the back surface of at least one part of the display panel, such that the adhesive tape is disposed on the side distal from the display panel of the circuit board, and at least one part of the at least one electronic device in the device region is disposed between the adhesive tape and the back surface of the display panel;

wherein the adhesive tape comprises a first insulating layer, a functional layer, and a second insulating layer that are sequentially laminated; wherein the first insulating layer is bonded to at least one part of the circuit board and at least one part of the display panel, and the functional layer comprises at least one of an electromagnetic shielding layer, an electromagnetic wave absorbing layer, and a heat dissipating layer.

Optionally, the adhesive tape is disposed between a bearer film and a transfer film; and bonding the side surface of the adhesive tape to the back surface of at least one part of the circuit board and the back surface of at least one part of the display panel includes:

tearing off the bearer film from the adhesive tape;

bonding the adhesive tape to the back surfaces of the circuit board and the display panel through the transfer film; and tearing off the transfer film from the adhesive tape.

Optionally, the transfer film is provided with an alignment hole, and the assembly method further includes:

prior to bonding the adhesive tape to the back surfaces of the device region of circuit board and the display panel through the transfer film, aligning the adhesive tape to bonding positions on the display panel and the circuit board through the alignment hole and a positioning component.

Optionally, the transfer film is provided with handle portions on two opposite sides;

tearing off the bearer film from the adhesive tape includes:

separating the transfer film and the adhesive tape from the bearer film by holding the handle portions with hands; and tearing off the transfer film from the adhesive tape includes:

tearing off the transfer film from the adhesive tape by holding the handle portions with hands.

DETAILED DESCRIPTION

For clearer descriptions of the objectives, technical solutions and advantages in the present disclosure, the present disclosure is described in detail below in combination with the accompanying drawings.

Figure 1:
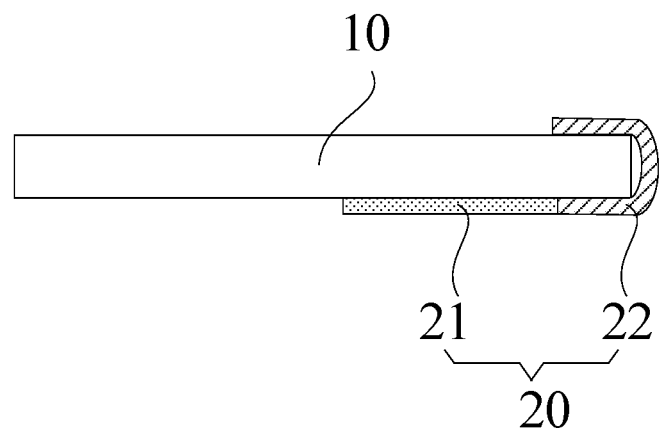
FIG. 1 is a structural diagram of a display device according to an embodiment of the present disclosure.

FIG. 1 is a structural diagram of a display device according to an embodiment of the present disclosure. As shown in FIG. 1, the display device includes a display panel 10 and a circuit board 20. One end of the circuit board 20 is connected to the display panel 10 and the other end of the circuit board 20 is disposed on a back surface of the display panel 10, that is, the circuit board 20 is at least partially disposed on the back surface of the display panel 10. Here, the back surface of the display panel 10 refers to a side surface opposite to a display surface of the display panel 10. The display surface is a side surface that displays a picture and may be called a light-emergence surface.

Figure 2:
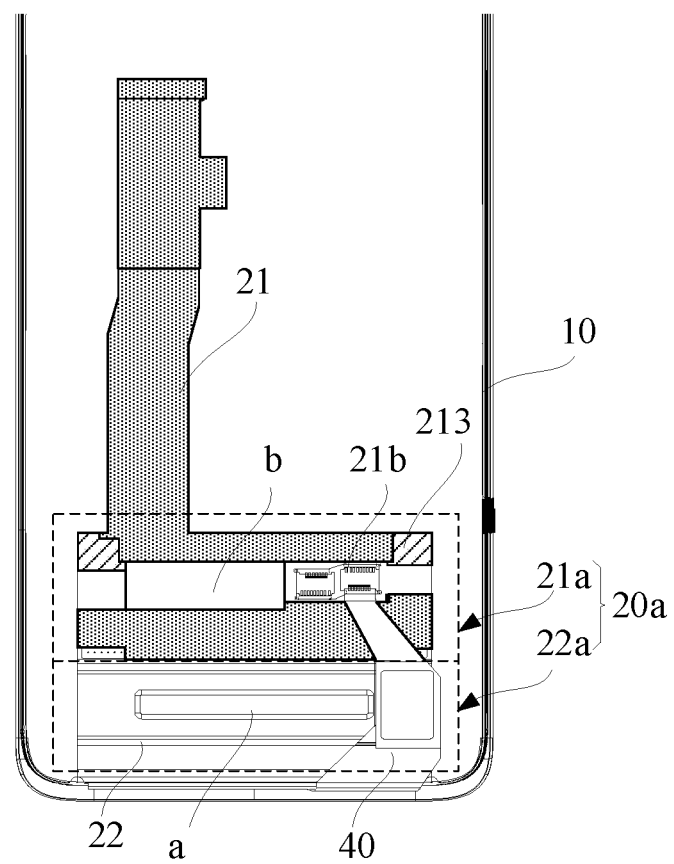
FIG. 2 is a partial structural diagram of a display device according to an embodiment of the present disclosure.

FIG. 2 is a partial structural diagram of a display device according to an embodiment of the present disclosure and shows a structure of the circuit board on the back surface of the display panel. As shown in FIG. 2, the circuit board 20 includes a device region 20a on a side distal from the display panel 10. The display device further includes an electronic device, such as a driving IC (integrated circuit) chip, disposed in the device region 20a.

Figure 3:
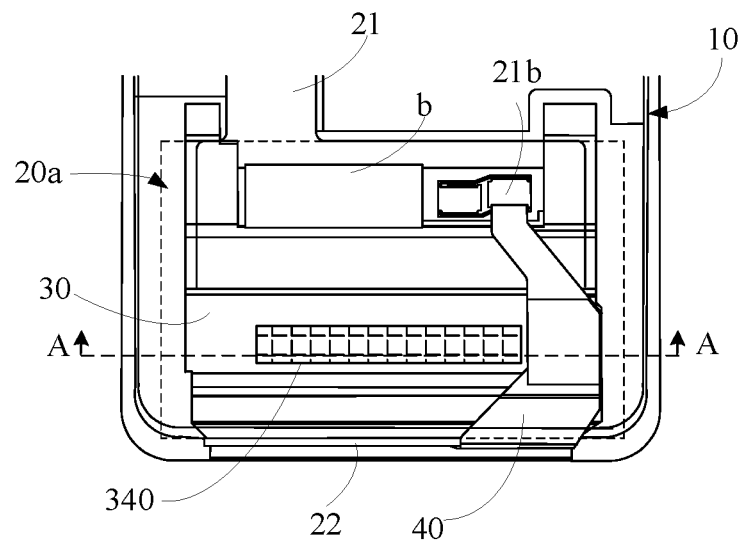
FIG. 3 is a structural diagram of a display device according to an embodiment of the present disclosure.
Figure 4:
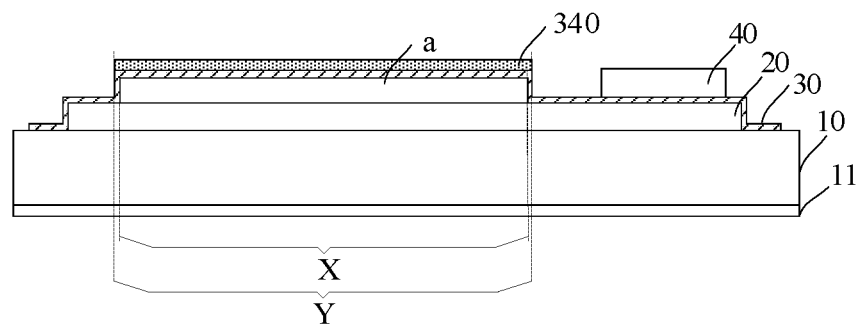
FIG. 4 is a sectional structural diagram of a display device according to an embodiment of the present disclosure.

FIG. 3 is a partial structural diagram of a display device according to an embodiment of the present disclosure. FIG. 4 is a sectional structural diagram of a display device according to an embodiment of the present disclosure. As shown in FIGS. 3 and 4, the display device further includes an adhesive tape 30 disposed on a side, distal from the display panel 10, of the circuit board 20 and bonded to a back surface of at least one part of the circuit board 20 and the back surface of at least one part of the display panel 10. That is, the adhesive tape 30 is bonded to both the back surfaces of the circuit board 20 and the display panel 10 so as to fix the circuit board 20 to the back surface of the display panel 10. At least one part of the at least one electronic device (such the IC chip a) in the device region 20a is disposed between the adhesive tape 30 and the back surface of the display panel 10.

In the embodiment of the present disclosure, the circuit board is fixed to the back surface of the display panel with the adhesive tape. Bonding only needs to be performed for one time after the adhesive tape, the circuit board, and the display panel are aligned, the circuit board can be bonded to the back surface of the display panel. Thus, the operation procedure can be simplified, the labor cost is reduced and the operation efficiency is improved. In addition, the adhesive tape can further play a role of protecting the electronic device, disposed between the adhesive tape and the back surface of the display panel, on the circuit board to certain extent.

Exemplarily, the display device in the embodiment of the present disclosure may be a mobile terminal, such as a mobile phone, a tablet computer or a smart watch, or terminal equipment such as a television. Any display device that needs to fix the circuit board on the back surface of the display panel can adopt the structure of the embodiment of the present disclosure.

Exemplarily, the display panel 10 may be an organic light-emitting diode (OLED) display panel. Of course, the display panel may also be a liquid crystal display panel, a miniature light-emitting diode display panel or other type of display panel.

The OLED display panel includes an active matrix OLED (AMOLED) and a passive matrix OLED (PMOLED). As a driving circuit in the AMOLED is more complex, the circuit board is provided with a larger area and thus a driving IC chip has a larger volume. As a result, the circuit board and the display panel more need to be bonded stably and hence, the present solution is more suitable for an AMOLED display panel.

Optionally, the display panel 10 may also be integrated with a touch function. That is, the display device may further include a touch layer integrated on the display panel 10. In one possible implementation mode, the touch layer is disposed inside the display panel 10. In another possible implementation mode, the touch layer may also be connected to the display surface of the display panel 10. For example, as shown in FIG. 4, the touch layer 11 is connected to the display surface of the display panel 10. Exemplarily, the touch layer may adopt a self-capacitance touch structure or a mutual-capacitance touch structure, which is not limited in the present disclosure.

With reference to FIGS. 1 and 2 again, in the embodiment of the present disclosure, the circuit board 20 includes a first flexible circuit board 21 and a packaging circuit board 22. One end of the packaging circuit board 22 is connected to the display panel 10, and the other end of the packaging circuit board 22 is connected to one end of the first flexible circuit board 21. The device region 20*a* includes a partial region 22*a* of the packaging circuit board 22 and a partial region 21*a* of the first flexible circuit board 21. That is, the device region 20*a* includes regions, proximal to a connection position of the first flexible circuit board 21 and the packaging circuit board 22, in the first flexible circuit board 21 and the packaging circuit board 22.

The electronic devices in the device region 20*a* include, but are not limited to the driving IC (integrated circuit) chip and other electronic components, such as a capacitor and a resistor. Exemplarily, in the embodiment shown in FIG. 3, a part of the electronic devices, such as an electronic device b, is disposed outside the adhesive tape 30, that is the electronic device is not covered by the adhesive tape 30; and a part of the electronic devices, such the driving IC chip a, is covered by the adhesive tape 30. In other embodiments, it is also possible to cover all the electronic devices by the adhesive tape.

Exemplarily, one end of the packaging circuit board 22 is connected to the display panel 10, and the other end of the packaging circuit board 22 is folded to the back surface of the display panel 10. The driving IC chip a is disposed on the packaging circuit board 22. Exemplarily, the device region 20*a* may include all regions, disposed on the back surface of the display panel 10, of the packaging circuit board 22.

Optionally, the packaging circuit board 22 may be a chip on glass (COG) circuit board, a chip on film (COF) circuit board, or a chip on Pi (COP) circuit board. Here, COG, COF and COP are three circuit encapsulation modes, one of which is usually adopted for binding to the display panel and the FPC in the display device.

Figure 5:
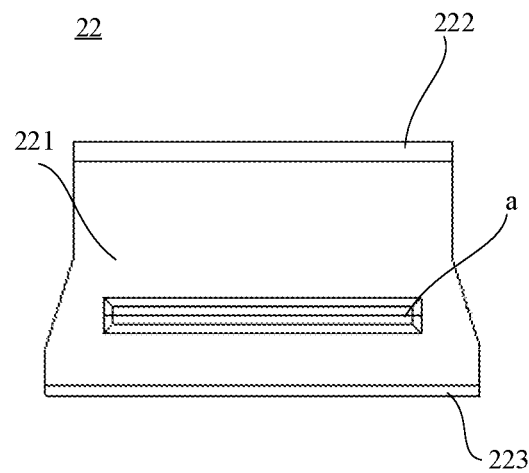
FIG. 5 is a structural diagram of a packaging circuit board according to an embodiment of the present disclosure.

The structure of the packaging circuit board is illustrated below by taking the structure of the COF circuit board as an example. FIG. 5 is a structural diagram of a COF circuit board according to an embodiment of the present disclosure. As shown in FIG. 5, the COF circuit board (i.e., the packaging circuit board 22) includes a film circuit board body 221 (i.e., a COF) having the driving IC chip a disposed at a middle portion thereof.

The COF circuit board further includes first inner lead bonding (ILB) 222 and first outer lead bonding (OLB) 223 both on the film circuit board body 221. The first inner lead bonding 222 is electrically connected to the first flexible circuit board 21 and the first outer lead bonding 223 is electrically connected to a circuit binding region of the display panel 10.

Figure 6:
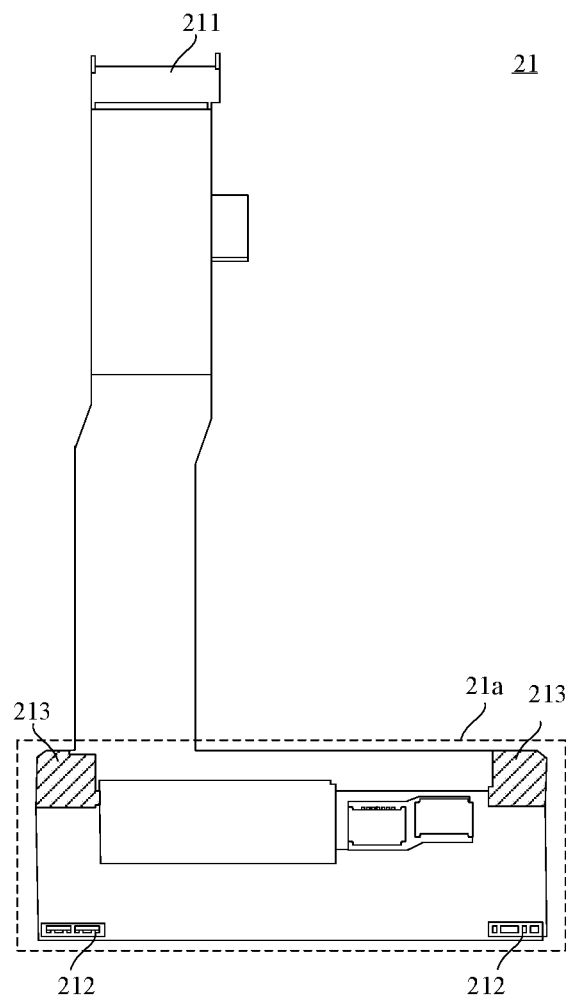
FIG. 6 is a structural diagram of a first flexible circuit board according to an embodiment of the present disclosure.

FIG. 6 is a structural diagram of a first flexible circuit board according to an embodiment of the present disclosure. As shown in FIG. 6, the first flexible circuit board 21 is provided with a first connecting terminal 211 at one end for being connected to a main board of the display device. The first flexible circuit board 21 is provided with a second connecting terminal 212 at the other end for being connected to the packaging circuit board 22. The first flexible circuit board 21 may also be called a main flexible circuit board.

Since one end of the first flexible circuit board 21 is connected to the packaging circuit board 22, and the other end of the flexible circuit board 21 is connected to the main board (not shown) of the display device, the driving IC chip a on the packaging circuit board 22 can be electrically connected to the main board through the first flexible circuit board 21 and meanwhile is further electrically connected to the display panel 10 through a connecting line on the packaging circuit board 22. Thus, under the control of the main board of the display device, the driving IC chip a may control the display panel 10 to display the picture.

Exemplarily, the device region 20*a* may further include a region, connected to the packaging circuit board 22, of the first flexible circuit board 21, such as a wider region 21*a* of the first flexible circuit board 21 in FIG. 6.

Optionally, in conjunction with FIGS. 3 and 4, the display device may further include a second flexible circuit board 40. One end of the second flexible circuit board 40 is connected to the touch layer, and the other end of the second flexible circuit board 40 is connected to the first flexible circuit board 21. The second flexible circuit board 40 is bonded to an outer surface of the adhesive tape 30, which is a surface that is oriented away from the back surface of the display panel 10.

Exemplarily, as shown in FIGS. 2 and 3, the first flexible circuit board 21 is provided with a touch region 21*b* which is not covered by the adhesive tape 30 and is exposed to the adhesive tape 30, thereby facilitating connecting one end of the second flexible circuit board 40 with the first flexible circuit board 21.

It should be noted that in some embodiments, a circuit connection structure corresponding to a touch function (i.e., a circuit structure on the second flexible circuit board 40) may also be integrated on the first flexible circuit board 21.

Figure 7:
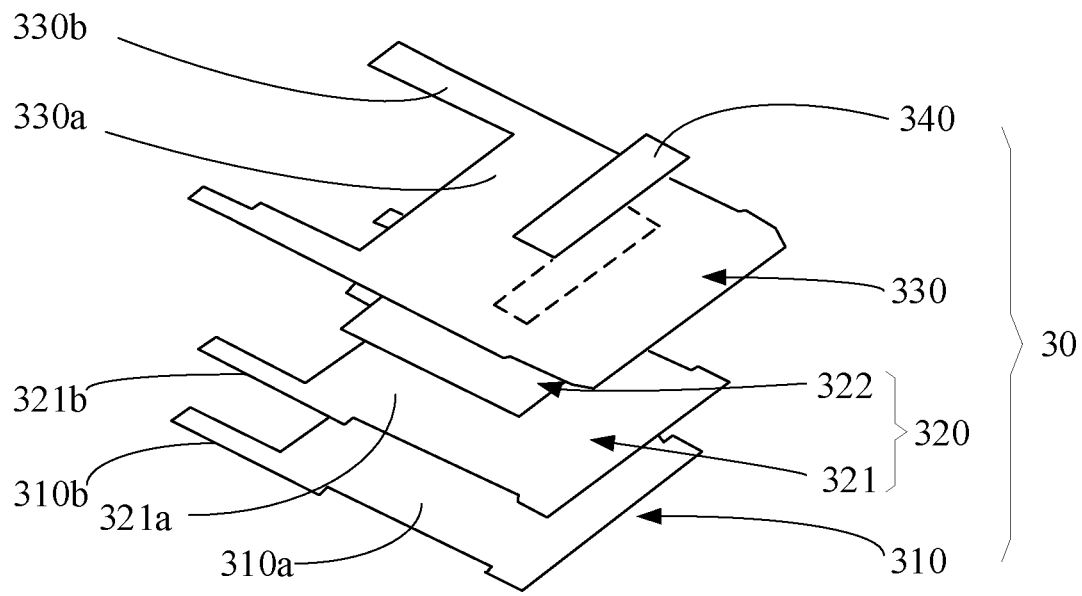
FIG. 7 is an exploded structural diagram of an adhesive tape according to an embodiment of the present disclosure.

FIG. 7 is an exploded structural diagram of an adhesive tape according to an embodiment of the present disclosure. As shown in FIG. 7, the adhesive tape 30 includes a first insulating layer 310, a functional layer 320, and a second insulating layer 330 that are sequentially laminated. The first insulating layer 310 is bonded to at least one part of the circuit board 20 and at least one part of the display panel 10 respectively.

Optionally, the functional layer 320 may include at least one of an electromagnetic shielding layer, an electromagnetic wave absorbing layer, and a heat dissipating layer. That is, the functional layer 320 may adopt a multi-layer structure. For example, in the embodiment shown in FIG. 7, the functional layer 320 includes an electromagnetic shielding layer 321 and an electromagnetic wave absorbing layer 322. For example, in the embodiment shown in FIG. 8, the functional layer 320 includes an electromagnetic shielding layer 321, an electromagnetic wave absorbing layer 322, and a heat dissipating layer 323. In other embodiments, the functional layer 320 may also adopt a single-layer structure. That is, the functional layer only includes one of the electromagnetic shielding layer, the electromagnetic wave absorbing layer, and the heat dissipating layer.

When the functional layer includes the electromagnetic shielding layer and the electromagnetic wave absorbing layer, and the electromagnetic shielding layer and the electromagnetic wave absorbing layer can play a role of shielding electromagnetic interference, thereby preventing abnormal display of the display device. When the functional layer includes the heat dissipating layer, the heat dissipating layer can dissipate heat of the electronic device. The functional layer in the middle may be protected since the insulating layers cover two sides of the functional layer respectively. In addition, if the functional layer includes a metal material, the first insulating layer and the second insulating layer may also avoid short circuit caused by unnecessary exposure of the metal material.

Figure 9:
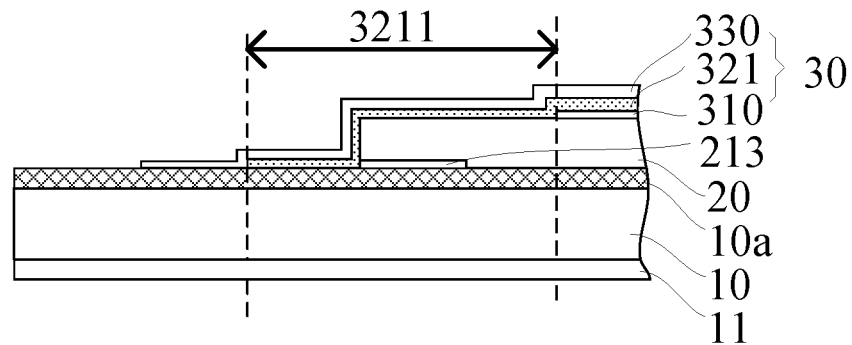
FIG. 9 is a schematic sectional view at a ground terminal of a circuit board according to an embodiment of the present disclosure.

FIG. 9 is a schematic sectional view at a ground terminal of a circuit board according to an embodiment of the present disclosure. In one possible implementation mode, as shown in FIG. 9, the functional layer 320 includes the electromagnetic shielding layer 321. The second insulating layer 330 covers the electromagnetic shielding layer 321, and the electromagnetic shielding layer 321 is provided with an exposed region 3211 not covered by the first insulating layer 310. The electromagnetic shielding layer 321 is conductive.

Exemplarily, as shown in FIG. 9, the display panel 10 may be provided with a metal layer 10a on the back surface, such as copper foil, which mainly plays a role of dissipating heat. This metal layer 10a may cover most of the back surface of the display panel 10. The circuit board 20 is provided with a ground terminal 213 on an edge. The exposed region 3211 of the electromagnetic shielding layer 321 is electrically connected to the metal layer 10a and the ground terminal 213 (also called a copper-exposed region).

When the circuit board is fixed onto the back surface of the display panel through the adhesive tape, the adhesive tape may cover a part of the electronic devices, such as the driving IC chip. Thus, the electromagnetic shielding layer may play a role of electromagnetic shielding for the covered electronic device on the circuit board. In addition, as the exposed region is electrically connected to the metal layer and the ground terminal, the grounding of the circuit board is achieved.

Optionally, the electromagnetic shielding layer, the first insulating layer and the second insulating layer each include a main body portion and a connecting arm protruding from a side of the main body portion. The main body portions of both the first insulating layer and the second insulating layer wrap the main body portion of the electromagnetic shielding layer. The connecting arm of the second insulating layer covers the connecting arm of the electromagnetic shielding layer. The exposed region of the electromagnetic shielding layer is disposed on the connecting arm of the electromagnetic shielding layer.

Figure 8:
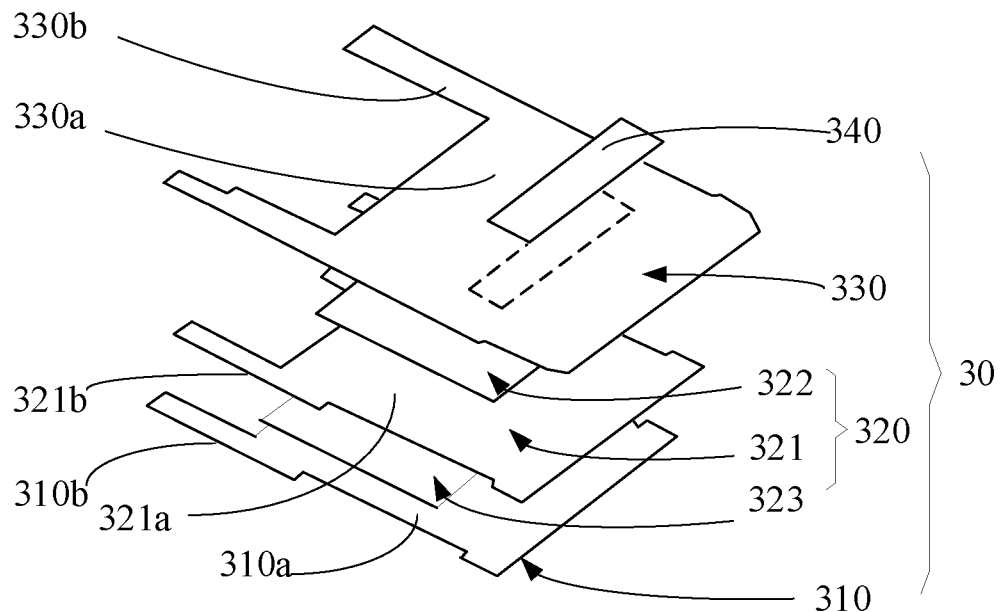
FIG. 8 is an exploded structural diagram of another adhesive tape according to an embodiment of the present disclosure.
Figure 10:
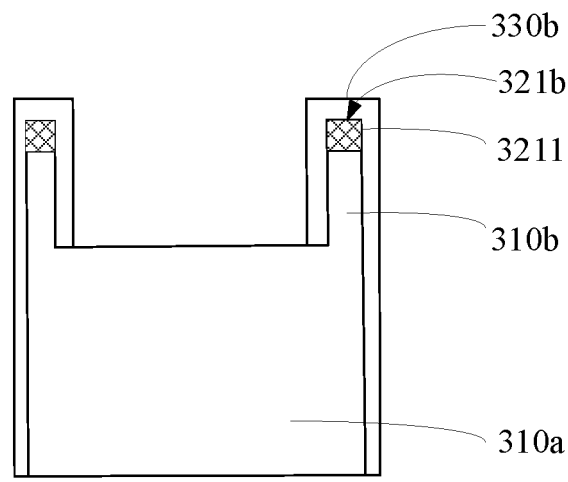
FIG. 10 is a structural diagram, viewed from a side, of a further adhesive tape according to an embodiment of the present disclosure.

Exemplarily, as shown in FIGS. 7 and 8, the electromagnetic shielding layer 321 includes a main body portion 321a and a connecting arm 321b protruding from a side of the main body portion 321a. The first insulating layer 310 includes a main body portion 310a and a connecting arm 310b protruding from a side of the main body portion 310a. The second insulating layer 330 includes a main body portion 330a and a connecting arm 330b protruding from a side of the main body portion 330a. In conjunction with FIG. 10, the connecting arm 330b has a length greater than that of the connecting arm 321b and a width greater than that of the connecting arm 321b, such that the connecting arm 330b may cover the connecting arm 321b. The connecting arm 321b has a length greater than that of the connecting arm 310b and a width less than or equal to that of the connecting arm 310b, such that an end of the connecting arm 321b may be exposed to the connecting arm 310 and an exposed part is the exposed region 3211.

Optionally, as shown in FIGS. 7 and 8, the electromagnetic shielding layer 321, the first insulating layer 310 and the second insulating layer 330 each have two connecting arms, i.e., 321b, 310b and 330b. In conjunction with FIG. 3, the two connecting arms 321b of the electromagnetic shielding layer 321, the two connecting arms 310b of the first insulating layer 310 and the two connecting arms 330b of the second insulating layer 330 are disposed on two sides of one side edge (such as an upper side edge of the device region 20a in FIG. 0.3) of the device region 20a of the flexible circuit board 20, respectively. Correspondingly, as shown in FIG. 6, the first flexible circuit board 21 have ground terminals 213 on two sides (i.e., two ends of one side edge of the device region). The two ground terminals 213 are connected to the metal layer on the display panel 10 through the adhesive tape 30. Thus, the grounding reliability of the circuit board may be improved.

Exemplarily, the main body portions 321a, 310a and 330a of the electromagnetic shielding layer 321, the first insulating layer 320 and the second insulating layer 330 all take the shape of a rectangle for facilitating manufacturing, but the shapes of the main body portions 321a, 310a and 330a of the electromagnetic shielding layer 321, the first insulating layer 320 and the second insulating layer 330 are not limited in the embodiment of the present disclosure as long as the main body portions 321a, 310a and 330a of the electromagnetic shielding layer 321, the first insulating layer 320 and the second insulating layer 330 can cover a desired region on the FPC.

Optionally, the functional layer may further include an electromagnetic wave absorbing layer wrapped between a first film layer and a second film layer; wherein the first film layer and the second film layer are layers, disposed on two sides of the electromagnetic wave absorbing layer, in the adhesive tape.

Exemplarily, as shown in FIGS. 7 and 8, the electromagnetic wave absorbing layer 322 is disposed between the second insulating layer 330 and the electromagnetic shielding layer 321. That is, the first film layer is one of the electromagnetic shielding layer 321 and the second insulating layer 330, and the second film layer is the other of the electromagnetic shielding layer 321 and the second insulating layer 330. In such a case, both the first film layer and the second film layer are layers adjacent to the electromagnetic wave absorbing layer.

Alternatively, at least one of the first film layer and the second film layer may also be a layer not adjacent to the electromagnetic wave absorbing layer as long as the first film layer and the second film layer may wrap the electromagnetic wave absorbing layer. For example, the first film layer and the second film layer may be the first insulating layer 310 and the second insulating layer 330 respectively.

In the above implementation mode, since the electromagnetic wave absorbing layer 322 is wrapped by layers adjacent to two sides thereof, while absorbing the electromagnetic wave, the electromagnetic wave absorbing layer does not have the problem of powder dropping due to the exposure of the electromagnetic wave absorbing layer.

Optionally, the electromagnetic wave absorbing layer 322 has a shape similar to that of the main body portion 321a of the electromagnetic shielding layer 321. As such, the alignment of various film layers in manufacturing of the adhesive tape is facilitated.

Exemplarily, as shown in FIGS. 7 and 8, the electromagnetic wave absorbing layer 322 has a shape similar to that of the main body portion 321a of the electromagnetic shielding layer 321, that is, the same shape but different sizes. For example, both the electromagnetic wave absorbing layer 322 and the main body portion 321a of the electromagnetic shielding layer 321 are rectangular. In other embodiments, the electromagnetic wave absorbing layer 322 may also have a shape different from that of the main body portion 321a of the electromagnetic shielding layer 321. For example, the main body portion 321a of the electromagnetic shielding layer 321 is rectangular, whereas the electromagnetic wave absorbing layer 322 is hexagonal, circular, or the like, which is not limited in the present disclosure as long as the electromagnetic wave absorbing layer 322 can cover most of the main body portion 321a to achieve the effect of absorbing electromagnetic waves.

Optionally, the functional layer 320 may further include a heat dissipating layer which may be any layer disposed between the first insulating layer 310 and the second insulating layer 330. For example, the heat dissipating layer is disposed between the first insulating layer 310 and the electromagnetic shielding layer 321, or between the electromagnetic shielding layer 321 and the electromagnetic wave absorbing layer 322, or between the electromagnetic wave absorbing layer 322 and the second insulating layer 330. As the electronic device generates heat during operation and the accumulation of lots of heat will adversely affect the service life and the like of the electronic device, the heat of the electronic device may be transferred punctually by disposing the heat dissipating layer.

Exemplarily, as shown in FIG. 8, the heat dissipating layer 323 may be adjacent to the first insulating layer 310. By disposing the heat dissipating layer 323 at a position proximal to the circuit board, the heat dissipation of the electronic device on the circuit board is facilitated.

Optionally, the heat dissipating layer 323 may also have a shape similar to that of the main body portion 321a of the electromagnetic shielding layer 321. As such, the alignment of various film layers in manufacturing of the adhesive tape is facilitated.

Optionally, in the embodiment of the present disclosure, as shown in FIGS. 7 and 8, the adhesive tape 30 may further include an electronic device buffer layer 340 disposed on a side surface, distal from the display panel 10, of the second insulating layer 330. In conjunction with FIG. 4, an orthographic projection X of at least one part of the at least one electronic device (such as the driving IC chip a in FIG. 4) on the display panel 10 is within an orthographic projection Y of the electronic device buffer layer 340 on the display panel 10. The electronic device buffer layer can have a buffer and protection effect on the corresponding electronic device, thereby avoiding damage to the electronic device due to impact between the electronic device and a housing.

In the embodiment of the present disclosure, the electronic device buffer layer 340 is configured to protect at least one part of the at least one electronic device, such as the above driving IC chip a, on the circuit board. For better protecting the driving IC chip a, the electronic device buffer layer 340 may have a shape matching that of the driving IC chip a. As the driving IC chip is usually rectangular, the electronic device buffer layer may also be rectangular. Exemplarily, as shown in FIGS. 7 and 8, a dashed box in the figure denotes a region corresponding to the driving IC chip and is rectangular. Correspondingly, the electronic device buffer layer 340 is also rectangular.

It should be noted that the adhesive tape in the embodiment of the present disclosure (such as the embodiments shown in FIGS. 3, 7 and 8) may have one electronic device buffer layer, or more than one electronic device buffer layer. The number of the electronic device buffer layers may be set according to the number of the electronic devices to be protected.

Exemplarily, in the embodiment of the present disclosure, the electromagnetic shielding layer 321 includes a conductive fabric. The conductive fabric may be made of a knitted or textile material and a conductive layer (such as copper-nickel plating or carbon plating). Exemplarily, the electromagnetic shielding layer may have a thickness of 0.03-0.08 mm.

Exemplarily, the electromagnetic wave absorbing layer 322 may be made of at least one of ferrite and barium titanate. It should be noted that the electromagnetic wave absorbing layer in the embodiment of the present disclosure may also be made of other wave absorbing materials, which is not limited in the embodiment of the present disclosure. Exemplarily, the electromagnetic wave absorbing layer 322 may have a thickness of 0.035-0.08 mm.

Exemplarily, the heat dissipating layer 323 may be made of graphite so as to obtain a better heat dissipation effect. Exemplarily, the heat dissipating layer 323 may have a thickness of 0.01-0.05 mm.

Exemplarily, the electronic device buffer layer 340 may be made of foam.

Use of foam as the buffer layer achieves a smaller mass and an excellent buffer effect. Exemplarily, the electronic device buffer layer 340 may have a thickness of 0.1-0.5 mm.

Exemplarily, the first insulating layer 310 may be made of high-molecular polymer material, such as PE (polyethylene), PET (polyethylene terephthalate) and PI (polyimide). The second insulating layer 330 may also be made of a high-molecular polymer material, such as PE, PET, and PI. The first insulating layer 310 and the second insulating layer 330 may be made of the same material or different materials.

Optionally, the various functional layers, the functional layer, and the first insulating layer as well the functional layer and the second insulating layer may be bonded through bonding layers. The bonding layer may be any of a silica gel layer, an acrylic adhesive layer, a pressure-sensitive adhesive layer, and an optically clear adhesive (OCA) layer, which is not limited in the embodiment of the present disclosure.

Optionally, the first insulating layer 310 is provided with a bonding layer on the outer surface thereof which is a surface that is oriented away from the functional layer 320. In use, the adhesive tape may be directly bonded to the back surfaces of the FPC and the display panel, such that high convenience in use is achieved. In other embodiments, the first insulating layer 310 may not have the bonding layer on the outer surface thereof. When the adhesive tape needs to be used, a layer of adhesive is applied to a bonding region and then bonding is performed.

Exemplarily, the bonding layer on the first insulating layer 310 may be any of the silica gel layer, the acrylic adhesive layer, the pressure-sensitive adhesive layer and the OCA layer.

Optionally, the second insulating layer 330 is provided with a bonding layer on at least one part of the outer surface thereof which is a surface that is oriented away from the functional layer 320. By disposing the bonding layer on at least one part of the outer surface of the second insulating layer 330, bonding of the second flexible circuit board may be facilitated. Therefore, the position of the bonding layer on the outer surface of the second insulating layer 330 may be set according to the position of the second flexible circuit board, and is not limited in the embodiment of the present disclosure.

Exemplarily, the bonding layer on the second insulating layer 330 may be any of the silica gel layer, the acrylic adhesive layer, the pressure-sensitive adhesive layer, and the OCA layer.

In other embodiments, the second insulating layer 310 may not have the bonding layer on the outer surface thereof. When the touch FPC needs to be bonded using the adhesive tape, a layer of adhesive is applied to a region to which the touch FPC needs to be bonded and then bonding is performed.

Figure 11:
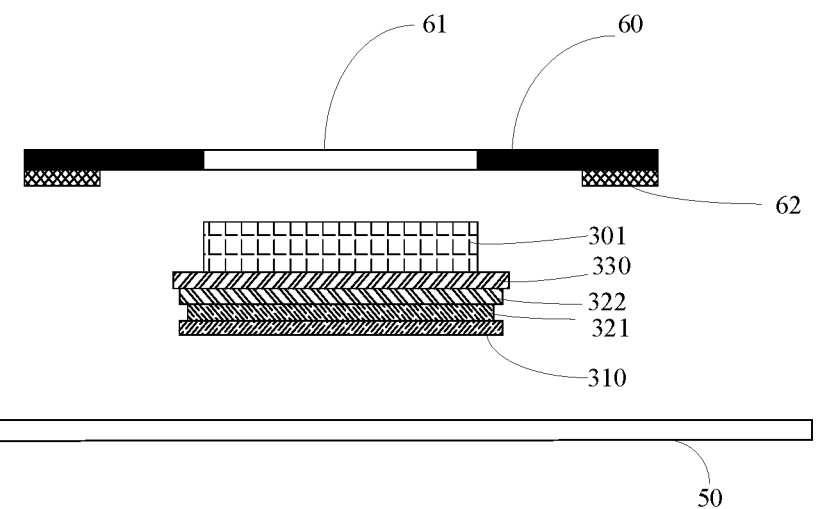
FIG. 11 is a structural diagram of an adhesive tape in an unused state according to an embodiment of the present disclosure.

Optionally, FIG. 11 is a structural diagram of an adhesive tape according to an embodiment of the present disclosure. As shown in FIG. 11, the adhesive tape 30 is provided with a bearer film 50 on a side surface. The first insulating layer 310, the functional layer 320 and the second insulating layer 330 are sequentially disposed on the bearer film 50. When the adhesive tape is not used, the bearer film may have a protection effect and meanwhile facilitates storage.

Exemplarily, the bearer film 50 has an area greater than that of the adhesive tape for placement of the adhesive tape. The first insulating layer 310 is provided with the bonding layer on the outer surface thereof. When not in use, this bonding layer on the first insulating layer 310 is bonded to the bearer film 50.

Optionally, as shown in FIG. 11, the second insulating layer 330 of the adhesive tape 30 is provided with a transfer film 60 on the outer surface thereof. The transfer film 60 can protect the other surface of the adhesive tape 30. Exemplarily, it can be seen from FIG. 2 that the transfer film 60 has an area greater than that of the adhesive tape. That is, the transfer film 60 may completely cover the adhesive tape 30, thereby protecting the adhesive tape.

Optionally, the transfer film 60 is provided with an opening 61 in which the electronic device buffer layer 340 is disposed. As the electronic device buffer layer 340 is disposed in the middle of the second insulating layer 330, if the transfer film 60 covers the electronic device buffer layer 340, it is easy to damage the electronic device buffer layer 340 when the transfer film 60 is torn. By disposing the opening, it is possible to avoid damage to the electronic device buffer layer when the transfer film is torn.

It should be noted that the shapes of the opening 61 and the electronic device buffer layer 340 are not limited in the embodiment of the present disclosure as long as the shape of the opening 61 matches that of the electronic device buffer layer 340.

Optionally, the transfer film 60 is provided with handle portions 62 on two opposite sides so as to facilitate transferring the adhesive tape when the adhesive tape is used. The handle portions 62 are non-adhesive for being held by hands. In one possible implementation mode, the surface of the transfer film 60 has adhesiveness so as to be bonded to the adhesive tape, and coating layers are bonded to the handle portions 62 on two sides of the transfer film 60, such that the handle portions 62 are non-adhesive.

Figure 12:
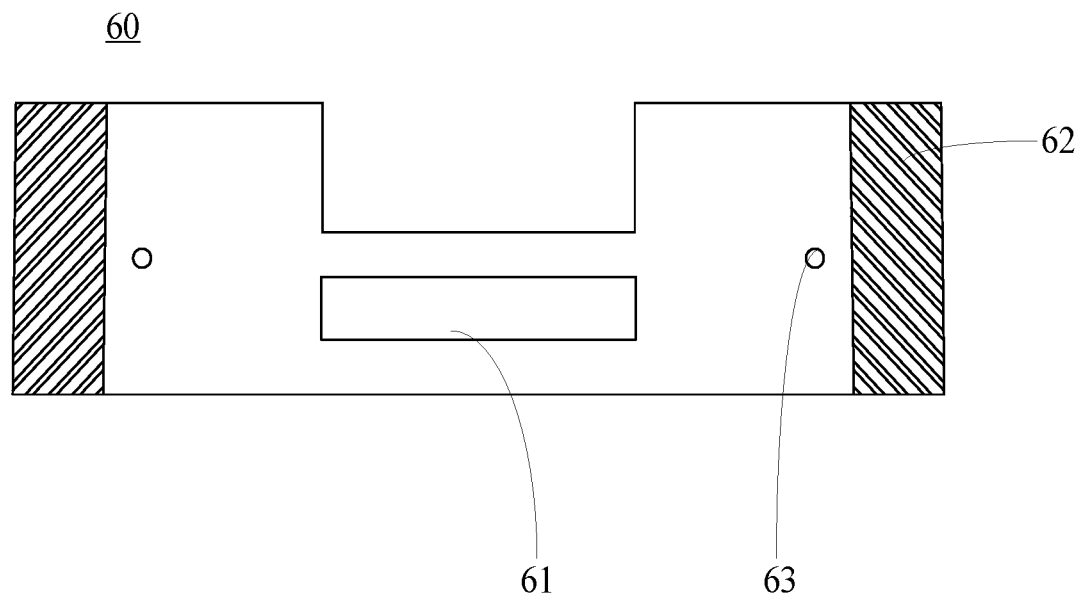
FIG. 12 is a structural diagram, viewed from a side, of a transfer film according to an embodiment of the present disclosure.

Exemplarily, as shown in FIG. 12, the handle portion 62 is rectangular, but the shape of the handle portion 61 is not limited. The two handle portions 62 may have the same shape or different shapes.

Optionally, as shown in FIG. 12, the transfer film 60 is provided with an alignment hole 63 in the middle portion thereof, such that when the circuit board and the display panel are bonded to each other with the adhesive tape, the alignment hole cooperates with a corresponding positioning component to position the adhesive tape. Exemplarily, the transfer film 60 is provided with two alignment holes 63 symmetrically disposed in two sides of the opening 61.

Exemplarily, both the transfer film 60 and the bearer film 50 may be release films, such as PET release films or PE release films.

Figure 13:
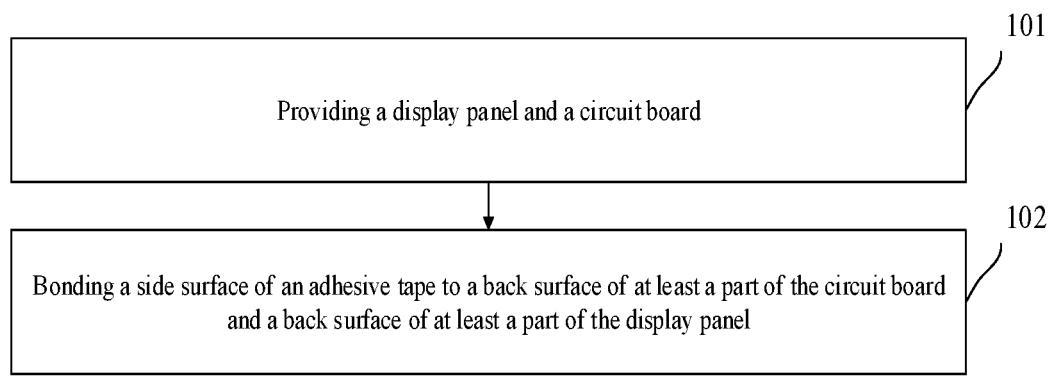
FIG. 13 is a flow chart of an assembly method of a display device according to an embodiment of the present disclosure.

An embodiment of the present disclosure further provides an assembly method of a display panel. As shown in FIG. 13, the method may include the following steps.

In step 101, a display panel and a circuit board are provided.

One end of the circuit board is connected to the display panel, and the circuit board is at least partially disposed on a back surface of the display panel and includes a device region at a side distal from the display panel. At least one electronic device is disposed in the device region.

In step 102, a side surface of the adhesive tape is bonded to at least one part of a back surface of the circuit board and at least one part of the back surface of the display panel.

By step 102, the adhesive tape is disposed on a side, distal from the display panel, of the circuit board, and at least one part of the at least one electronic device in the device region is disposed between the adhesive tape and the back surface of the display panel.

Optionally, for the adhesive tape shown in FIG. 11, the step of bonding the side surface of the adhesive tape to at least one part of the back surface of the circuit board and at least one part of the back surface of the display panel includes: tearing off the bearer film from the adhesive tape; bonding the adhesive tape to the device region of the circuit board and the back surface of the display panel through the transfer film; and tearing off the transfer film from the adhesive tape.

Optionally, prior to the step of bonding the adhesive tape to the device region of the circuit board and the back surface of the display panel through the transfer film, the assembly method further includes: aligning the adhesive tape to bonding positions on the display panel and the circuit board through the alignment hole and a positioning component.

Optionally, the step of tearing off the bearer film from the adhesive tape includes: separating the transfer film and the adhesive tape from the bearer film by holding the handle portions with hands; and the step of tearing off the transfer film from the adhesive tape includes: tearing off the transfer film from the adhesive tape by holding the handle portions with hands.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display device, comprising:
    a display panel;
    a circuit board, one end of the circuit board being connected to the display panel, the circuit board being at least partially disposed on a back surface of the display panel and comprising a device region on a side distal from the display panel;
    at least one electronic device disposed in the device region; and
    an adhesive tape disposed on the side distal from the display panel of the circuit board and bonded to a back surface of at least one part of the circuit board and the back surface of the display panel; wherein
    at least one part of the at least one electronic device in the device region is disposed between the adhesive tape and the back surface of the display panel;
    wherein the adhesive tape comprises a first insulating layer, a functional layer, and a second insulating layer that are sequentially laminated; wherein the first insulating layer is bonded to the at least one part of the circuit board and at least one part of the display panel, and the functional layer comprises at least one of an electromagnetic shielding layer, an electromagnetic wave absorbing layer, and a heat dissipating layer.

2. The display device according to claim 1, wherein the functional layer comprises the electromagnetic shielding layer, the second insulating layer covering the electromagnetic shielding layer, and the electromagnetic shielding layer being provided with an exposed region not covered by the first insulating layer; and
    the back surface of the display panel is provided with a metal layer, the circuit board is provided with a ground terminal on an edge, and the exposed region is electrically connected to both the metal layer and the ground terminal.

3. The display device according to claim 2, wherein the electromagnetic shielding layer, the first insulating layer, and the second insulating layer each comprise a main body portion and a connecting arm protruding from a side of the main body portion; wherein the main body portions of both the first insulating layer and the second insulating layer wrap the main body portion of the electromagnetic shielding layer, and the exposed region is disposed on the connecting arm of the electromagnetic shielding layer.

4. The display device according to claim 3, wherein a number of the connecting arms in each of the electromagnetic shielding layer, the first insulating layer and the second insulating layer is two; wherein the two connecting arms of each of the electromagnetic shielding layer, the first insulating layer, and the second insulating layer are disposed on two sides of one side edge of the device region of the circuit board respectively.

5. The display device according to claim 1, wherein the functional layer further comprises the electromagnetic wave absorbing layer wrapped between a first film layer and a second film layer in the adhesive tape; wherein the first film layer and the second film layer are disposed on two sides of the electromagnetic wave absorbing layer in the adhesive tape.

6. The display device according to claim 3, wherein the electromagnetic wave absorbing layer has a shape similar to that of the main body portion of the electromagnetic shielding layer.

7. The display device according to claim 3, wherein the functional layer further comprises the heat dissipating layer having a shape similar to that of the main body portion of the electromagnetic shielding layer.

8. The display device according to claim 1, wherein the adhesive tape further comprises an electronic device buffer layer disposed on a side surface, distal from the display panel, of the second insulating layer; wherein an orthographic projection of the at least one part of the at least one electronic device on the display panel is within an orthographic projection of the electronic device buffer layer on the display panel.

9. The display device according to claim 8, wherein the at least one part of the at least one electronic device comprises an integrated circuit chip on the circuit board, and the electronic device buffer layer has a shape similar to that of the integrated circuit chip.

10. The display device according to claim 1, wherein the circuit board comprises a first flexible circuit board and a packaging circuit board; wherein one end of the packaging circuit board is connected to the display panel and another end of the packaging circuit board is connected to one end of the first flexible circuit board, and the device region comprises a partial region of the packaging circuit board and a partial region of the first flexible circuit board.

11. The display device according to claim 10, further comprising a touch layer and a second flexible circuit board; wherein the touch layer is integrated on the display panel, one end of the second flexible circuit board is connected to the touch layer and another end of the second flexible circuit board is connected to the first flexible circuit board, and the second flexible circuit board is bonded to an outer surface of the adhesive tape, the outer surface of the adhesive tape is oriented away from the back surface of the display panel.

12. The display device according to claim 1, wherein the electromagnetic shielding layer comprises a conductive fabric.

13. The display device according to claim 1, wherein the electromagnetic wave absorbing layer is made of at least one of ferrite and barium titanate.

14. The display device according to claim 1, wherein the heat dissipating layer is made of graphite.

15. The display device according to claim 8, wherein the electronic device buffer layer is made of foam.

16. An assembly method of a display device, comprising:
    providing a display panel and a circuit board, one end of the circuit board being connected to the display panel, the circuit board being at least partially disposed on a back surface of the display panel and comprising a device region on a side distal from the display panel, wherein at least one electronic device is disposed in the device region; and
    bonding a side surface of an adhesive tape to a back surface of at least one part of the circuit board and a back surface of at least one part of the display panel, such that the adhesive tape is disposed on the side distal from the display panel of the circuit board, and at least one part of the at least one electronic device in the device region is disposed between the adhesive tape and the back surface of the at least one part of the display panel;
    wherein the adhesive tape comprises a first insulating layer, a functional layer, and a second insulating layer that are sequentially laminated; wherein the first insulating layer is bonded to the at least one part of the circuit board and the at least one part of the display panel, and the functional layer comprises at least one of an electromagnetic shielding layer, an electromagnetic wave absorbing layer, and a heat dissipating layer.

17. The assembly method according to claim 16, wherein the adhesive tape is disposed between a bearer film and a transfer film; and bonding the side surface of the adhesive tape to the back surface of the at least one part of the circuit board and the back surface of the at least one part of the display panel comprises:

tearing off the bearer film from the adhesive tape;

bonding the adhesive tape to the back surfaces of the circuit board and the display panel through the transfer film; and tearing off the transfer film from the adhesive tape.

18. The assembly method according to claim 17, wherein the transfer film is provided with an alignment hole, and the assembly method further comprises:

prior to bonding the adhesive tape to the back surfaces of the circuit board and the display panel through the transfer film, aligning the adhesive tape to bonding positions on the display panel and the circuit board through the alignment hole and a positioning component.

19. The assembly method according to claim 17, wherein the transfer film is provided with handle portions on two opposite sides;

tearing off the bearer film from the adhesive tape comprises:

separating the transfer film and the adhesive tape from the bearer film by holding the handle portions with hands; and tearing off the transfer film from the adhesive tape comprises:

tearing off the transfer film from the adhesive tape by holding the handle portions with hands.

* * * * *